United States Patent
Yi et al.

(10) Patent No.: US 12,384,075 B2
(45) Date of Patent: Aug. 12, 2025

(54) PROCESSING METHOD AND SYSTEM FOR REDUCING WARP OF NITROGEN-DOPED WAFER

(71) Applicant: XI'AN ESWIN MATERIAL TECHNOLOGY CO., LTD., Xi'an (CN)

(72) Inventors: Na Yi, Xi'an (CN); Rongkai Linghu, Xi'an (CN); Wen Zhang, Xi'an (CN); Ying Lu, Xi'an (CN)

(73) Assignee: XI'AN ESWIN MATERIAL TECHNOLOGY CO., LTD., Xi'an (CN)

( * ) Notice: Subject to any disclaimer, the term of this patent is extended or adjusted under 35 U.S.C. 154(b) by 0 days.

(21) Appl. No.: 18/570,936

(22) PCT Filed: Sep. 21, 2022

(86) PCT No.: PCT/CN2022/120210
§ 371 (c)(1),
(2) Date: Dec. 15, 2023

(87) PCT Pub. No.: WO2023/051345
PCT Pub. Date: Apr. 6, 2023

(65) Prior Publication Data
US 2024/0262008 A1 Aug. 8, 2024

(30) Foreign Application Priority Data
Sep. 29, 2021 (CN) .......................... 202111155414.8

(51) Int. Cl.
*B28D 5/04* (2006.01)
*B28D 5/00* (2006.01)
*C30B 29/06* (2006.01)

(52) U.S. Cl.
CPC .......... *B28D 5/045* (2013.01); *B28D 5/0064* (2013.01); *C30B 29/06* (2013.01)

(58) Field of Classification Search
CPC .......... B28D 1/08; B28D 1/10; B28D 5/0064; B28D 5/045; B28D 7/005; B23D 57/0023; B23D 57/0007; B24B 49/14
(Continued)

(56) References Cited

U.S. PATENT DOCUMENTS

2006/0258268 A1\* 11/2006 Miyata .................. B28D 5/045
125/21
2009/0253352 A1 10/2009 Oishi et al.
(Continued)

FOREIGN PATENT DOCUMENTS

CN 101516573 A 8/2009
CN 103085180 A 5/2013
(Continued)

OTHER PUBLICATIONS

Written Opinion and International Search Report of the International Search Authority corresponding to International Application No. PCT/CN2022/120210, dated Dec. 27, 2022. (10 pages).
(Continued)

*Primary Examiner* — Brian D Keller
*Assistant Examiner* — Marcel T Dion
(74) *Attorney, Agent, or Firm* — Maginot, Moore & Beck LLP

(57) ABSTRACT

A processing method for reducing warp of a nitrogen-doped wafer includes dividing a to-be-cut nitrogen-doped crystal ingot into a plurality of to-be-processed crystal ingot segments according to nitrogen content distribution, where each to-be-processed ingot segment corresponds to a nitrogen content range. The method further includes determining a processing condition corresponding to each to-be-processed
(Continued)

dividing, according to nitrogen content distribution of the to-be-cut nitrogen-doped crystal ingot, a to-be-cut nitrogen-doped crystal ingot into a plurality of to-be-processed crystal ingot segments — S201 determining, according to correspondences between nitrogen content ranges and processing conditions, a processing condition corresponding to each to-be-processed crystal ingot segment — S202 performing, by using the processing condition corresponding to each to-be-processed crystal ingot segment, cutting processing respectively on the each to-be-processed crystal ingot segment, thereby obtaining a wafer by cutting the to-be-cut nitrogen-doped crystal ingot — S203 crystal ingot segment according to correspondences between nitrogen content ranges and processing conditions, where the processing condition enables the corresponding to-be-processed crystal ingot segment to be prevented from warping during wire sawing; and performing cutting processing respectively on the each to-be-processed crystal ingot segment by using the processing condition corresponding to each to-be-processed crystal ingot segment, thereby obtaining a wafer by cutting the to-be-cut nitrogen-doped crystal ingot.

3 Claims, 4 Drawing Sheets

(58) Field of Classification Search
USPC ..................................... 125/21, 16.01, 16.02
See application file for complete search history.

(56) References Cited

U.S. PATENT DOCUMENTS

| | | | | |
|---|---|---|---|---|
| 2015/0314484 | A1* | 11/2015 | Pietsch | B28D 5/045 |
| | | | | 125/21 |
| 2016/0236375 | A1* | 8/2016 | Hori | C30B 33/06 |
| 2016/0375514 | A1* | 12/2016 | Tian | B24D 18/0018 |
| | | | | 51/309 |
| 2018/0085969 | A1* | 3/2018 | Takahashi | B28D 5/045 |
| 2018/0108538 | A1* | 4/2018 | Katano | H01L 21/0262 |
| 2020/0016719 | A1 | 1/2020 | Kanbayashi | |

FOREIGN PATENT DOCUMENTS

| | | | |
|---|---|---|---|
| CN | 103817811 A | 5/2014 | |
| CN | 105745364 A | 7/2016 | |
| CN | 113815138 A | 12/2021 | |
| DE | 112018001068 T5 | 11/2019 | |
| EP | 2586583 A1 * | 5/2013 | ........... B28D 5/0064 |

OTHER PUBLICATIONS

English Translation of Written Opinion and International Search Report of the International Search Authority corresponding to International Application No. PCT/CN2022/120210, dated Dec. 27, 2022. (5 pages).
Taiwanese Office Action corresponding to Taiwanese Patent Application No. 111130892 dated May 23, 2023. (8 Pages).
English Translation of Taiwanese Office Action corresponding to Taiwanese Patent Application No. 111130892 dated May 23, 2023. (3 Pages).
Machine Translation of CN113815138A. (17 Pages).
Machine Translation of CN103817811A. (10 Pages).
Machine Translation of CN103085180A. (25 Pages).
German Office Action corresponding to German Patent Application No. 11 2022 002 557.3 dated Aug. 16, 2024. (4 Pages).
English Translation of German Office Action corresponding to German Patent Application No. 11 2022 002 557.3 dated Aug. 16, 2024. (5 Pages).

* cited by examiner

PROCESSING METHOD AND SYSTEM FOR REDUCING WARP OF NITROGEN-DOPED WAFER

CROSS-REFERENCE TO RELATED APPLICATION

The present application is the U.S. national phase of PCT Application No. PCT/CN2022/120210 filed on Sep. 21, 2022, which claims priority to the Chinese patent application No. 202111155414.8 filed in China on Sep. 29, 2021, a disclosure of which is incorporated herein by reference in its entirety.

TECHNICAL FIELD

The present disclosure relates to the field of wafer manufacturing technologies, in particular to a processing method and system for reducing warp of nitrogen-doped wafer.

BACKGROUND

Currently, in the process of large-size semiconductor-grade monocrystalline silicon wafers, monocrystalline silicon ingots (also referred to as crystal ingots or silicon ingots in some examples) pulled by the Czochralski method are commonly used. The Czochralski method includes melting polycrystalline silicon in a quartz crucible to obtain a silicon melt, immersing a monocrystalline seed into the silicon melt, and continuously pulling the seed to move away from a surface of the silicon melt, thereby a monocrystalline silicon ingot is grown at a phases interface during pulling.

SUMMARY

In view of this, embodiments of the present disclosure aim to provide a processing method and system for reducing warp of nitrogen-doped wafer, which can cut the nitrogen-doped crystal ingot to obtain wafers with good flatness and uniformity.

The technical solution of the embodiments of the present disclosure is implemented as follows.

In a first aspect, one embodiment of the present disclosure provides a processing method for reducing warp of a nitrogen-doped wafer, comprising:
dividing a to-be-cut nitrogen-doped crystal ingot into a plurality of to-be-processed crystal ingot segments according to nitrogen content distribution, wherein each to-be-processed ingot segment is corresponding to a nitrogen content range;
determining a processing condition corresponding to each to-be-processed crystal ingot segment according to correspondences between nitrogen content ranges and processing conditions, wherein the processing condition enables the corresponding to-be-processed crystal ingot segment to be prevented from warping during wire sawing; and
performing cutting processing respectively on the each to-be-processed crystal ingot segment by using the processing condition corresponding to each to-be-processed crystal ingot segment, thereby obtaining a wafer by cutting the to-be-cut nitrogen-doped crystal ingot.

In a second aspect, one embodiment of the present disclosure provides a processing system for reducing warp of a nitrogen-doped wafer, comprising: a dividing portion, a determining portion, and a processing portion;
wherein the dividing portion is configured to divide a to-be-cut nitrogen-doped crystal ingot into a plurality of to-be-processed crystal ingot segments according to nitrogen content distribution, wherein each to-be-processed ingot segment is corresponding to a nitrogen content range;
the determining portion is configured to determine a processing condition corresponding to each to-be-processed crystal ingot segment according to correspondences between nitrogen content ranges and processing conditions, wherein the processing condition enables the corresponding to-be-processed crystal ingot segment to be prevented from warping during wire sawing; and
the processing portion is configured to perform cutting processing respectively on the each to-be-processed crystal ingot segment by using the processing condition corresponding to each to-be-processed crystal ingot segment, thereby obtaining a wafer by cutting the to-be-cut nitrogen-doped crystal ingot.

DETAILED DESCRIPTION

Figure 1:
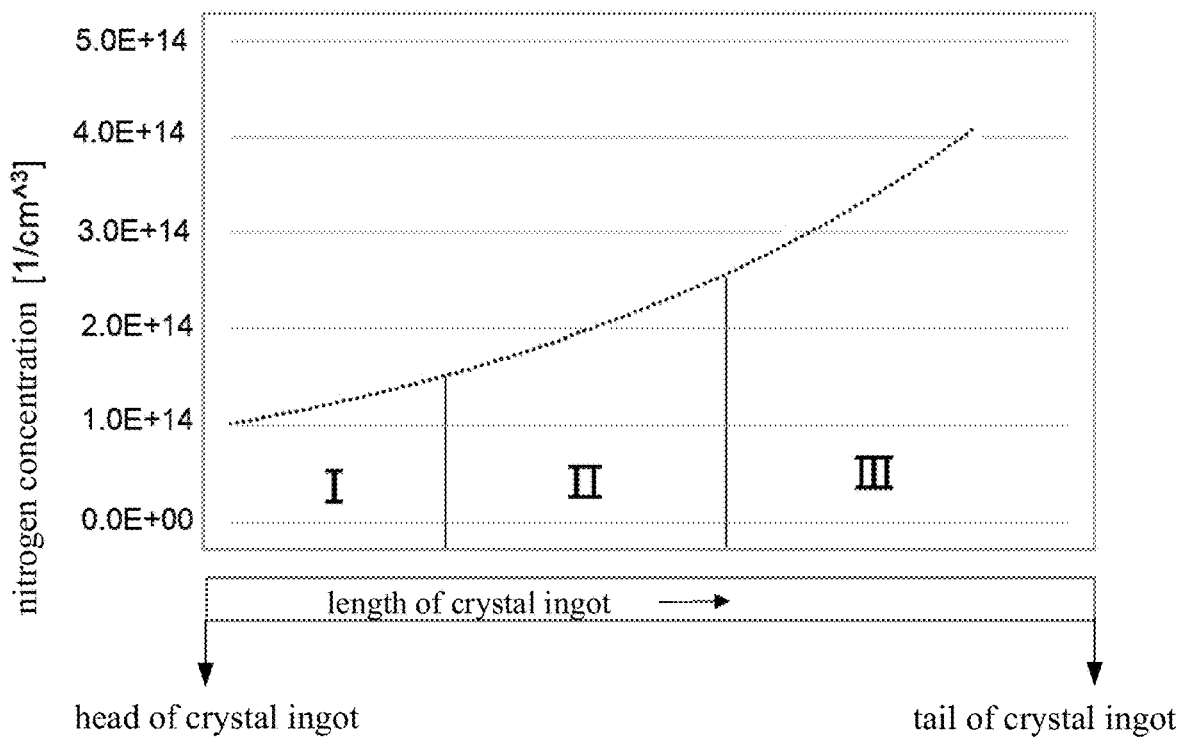
FIG. 1 is a schematic view showing nitrogen content distribution of a nitrogen-doped monocrystalline silicon ingot according to an embodiment of the present disclosure.

The technical solutions in the embodiments of the present disclosure will be clearly and completely described hereinafter with reference to the accompanying drawings in the embodiments of the present disclosure.

In the conventional scheme of pulling monocrystalline silicon ingots, the nitrogen doping technique is usually used to dope trace amounts of nitrogen into the monocrystalline silicon crystal, which can suppress the vacancy defects (Crystal Originated Particle, COP) that have a serious impact on the quality of the integrated circuits, thereby improving the yield of the integrated circuits. Oxygen precipitation and generation of secondary induced defects in the monocrystalline silicon ingots pulled by the Czochralski method can also be promoted, and high-quality clean areas in active areas on surfaces of silicon wafers obtained by subsequent cutting process can be generated, which is conducive to getter of metal impurities during the process of preparing integrated circuit devices. Moreover, the mechanical strength of the silicon wafers can also be improved.

Currently, in the process of pulling crystal ingots by the nitrogen doping technology, due to the small segregation coefficient of nitrogen, segregation phenomenon occurs, resulting in uneven nitrogen concentrations at various positions along an axial direction of the crystal ingot. For example, a nitrogen concentration at a tail of the crystal ingot is usually greater than that at a head of the crystal ingot. In addition, because the degree of effect achieved by nitrogen-doped monocrystalline silicon is usually determined by the nitrogen concentration, different mechanical strength is exhibited at various positions along the axial direction of the crystal ingot due to the different nitrogen concentrations, resulting in warping during the cutting process.

Further, for the solid-liquid interface, solubility of impurities in different phases is different, which causes concentration of impurities distributed in materials on both sides of the interface to be different. This is the impurity segregation phenomenon, and the size of the impurity segregation effect is usually described by the segregation coefficient. In the process of pulling monocrystalline silicon ingots by the Czochralski method, a solid-liquid interface is formed between the silicon melt and the monocrystalline silicon ingot. If nitrogen elements are regarded as impurities, then when the influence of melt convection on solute segregation is considered, an effective segregation coefficient of impurity segregation can be obtained after using Burton approximation. The effective segregation coefficient is as shown in the following equation 1:

$$k_{effective} = \frac{C_s}{C_l} = \frac{k_0}{k_0 + (1 - k_0)\exp\left(-\frac{V}{D}\delta\right)} \quad (1)$$

where $C_s$ represents a solid phase impurity concentration; $C_l$ represents an impurity concentration inside the melt; $k_0$ represents an equilibrium segregation coefficient of the impurity, nitrogen is regarded as an impurity in embodiments of the present disclosure, and the value may be selected as $7 \times 10^{-4}$.

From the above formula, it can be seen that the effective segregation coefficient of nitrogen is usually very small. Therefore, in the process of pulling monocrystalline silicon ingots by the Czochralski method, with the pulling of the crystal ingot nitrogen element show segregation phenomenon along an axial direction of the crystal ingot, resulting in uneven nitrogen concentration along the axial direction of the entire crystal ingot. This is usually manifested as shown in FIG. 1, where the nitrogen content gradually decreases from a tail of the crystal ingot to a head of the crystal ingot. Specifically, the nitrogen content at the tail of the crystal ingot is significantly greater than that at the head of the crystal ingot. Since the nitrogen content is positively correlated with mechanical strength, based on the occurrence of the above segregation phenomenon, the mechanical strength of various parts of the crystal ingot also varies with the change of nitrogen content. For example, the nitrogen content at a tail of the crystal ingot is greater than that at a head of the crystal ingot, so the mechanical strength of the tail of the crystal ingot is also significantly greater than that at the head of the crystal ingot. As such, when the entire nitrogen-doped monocrystalline silicon ingot is wire-sawed or multi-wire sawed, if the entire nitrogen-doped monocrystalline silicon ingot is processed under the same processing conditions, the heat generated in the processing process cannot be dissipated in time due to the high mechanical strength of the tail of the crystal ingot and the insufficient feed amount of the cutting steel wire. At this time, the accumulated heat causes wafers cut from the tail of the crystal ingot to warp more severely compared to wafers cut from the head of the crystal ingot.

Figure 2:
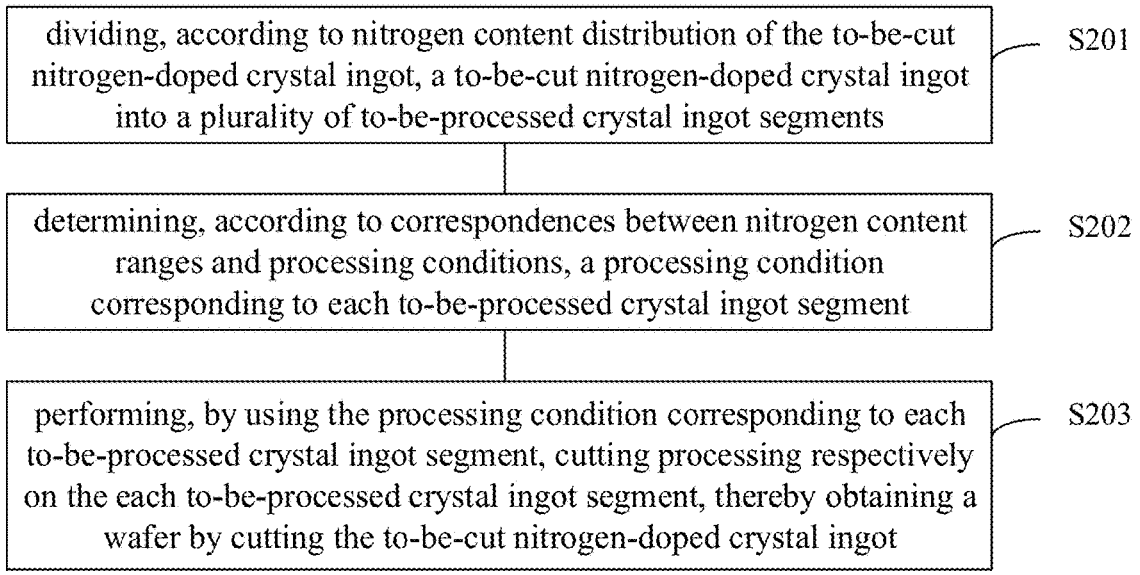
FIG. 2 is a schematic flowchart of a processing method for reducing warp of nitrogen-doped wafer according to an embodiment of the present disclosure.

Based on the above description, embodiments of the present disclosure aim to provide a processing scheme for reducing warp of a nitrogen-doped wafer. By considering the overall nitrogen content of the nitrogen-doped monocrystalline silicon ingot, different wire sawing processing conditions are used respectively, thereby improving the cutting efficiency, reducing the probability of warping problem, and obtaining wafers with good flatness and uniformity. Based on this, referring to FIG. 2, FIG. 2 shows a processing method for reducing warp of nitrogen-doped wafer according to an embodiment of the present disclosure. The method may comprising:

S201: dividing, according to nitrogen content distribution of the to-be-cut nitrogen-doped crystal ingot, a to-be-cut nitrogen-doped crystal ingot into a plurality of to-be-processed crystal ingot segments, where each to-be-processed ingot segment is corresponding to a nitrogen content range;

S202: determining, according to correspondences between nitrogen content ranges and processing conditions, a processing condition corresponding to each to-be-processed crystal ingot segment, where the processing condition enables the corresponding to-be-processed crystal ingot segment to be prevented from warping during wire sawing;

S203: performing, by using the processing condition corresponding to each to-be-processed crystal ingot segment, cutting processing respectively on the each to-be-processed crystal ingot segment, thereby obtaining a wafer by cutting the to-be-cut nitrogen-doped crystal ingot.

Through the technical solution shown in FIG. 2, the to-be-cut nitrogen-doped crystal ingot is divided into different to-be-processed crystal ingot segments according to the nitrogen content ranges. After determining the processing conditions that can avoid the warping phenomenon for each to-be-processed crystal ingot segment respectively, the corresponding to-be-processed crystal ingot segments are cut according to the corresponding processing conditions, thereby obtaining wafers with good flatness and uniformity, and reducing the probability of warping problem.

For the technical solution shown in FIG. 2, in some possible implementations, before performing the step S201, the method may further comprising: detecting the nitrogen content distribution of the to-be-cut nitrogen-doped crystal ingot.

For the above implementation, in some examples, the detecting the nitrogen content distribution of the to-be-cut nitrogen-doped crystal ingot, comprising:

collecting detection samples corresponding to multiple axial sampling positions along an axial direction of the to-be-cut nitrogen-doped crystal ingot;

cooling each detection sample rapidly after eliminating thermal donors of each detection sample, and using a Fourier Transform Infrared Spectrometer (FTIR) to detect a nitrogen content corresponding to each detection sample after cooling, to obtain nitrogen contents of the multiple axial sampling positions characterizing the nitrogen content distribution of the to-be-cut nitrogen-doped crystal ingot.

Figure 3:
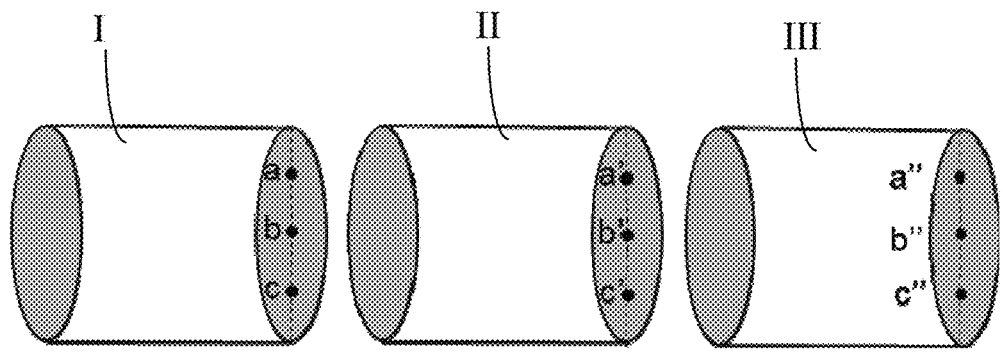
FIG. 3 is a schematic view of a to-be-processed crystal ingot segment obtained by cutting a nitrogen-doped crystal ingot according to an embodiment of the present disclosure.

It is to be noted that through the foregoing implementation, the nitrogen content distribution of the entire to-be-cut nitrogen-doped crystal ingot can be obtained. As shown in FIG. 1, for example, by setting appropriate nitrogen content thresholds, the nitrogen content distribution can be divided into three sections, which are marked as I, II, and III shown in FIG. 1. The section I corresponds to a head part of the entire to-be-cut nitrogen-doped crystal ingot; the section III corresponds to a tail part of the entire to-be-cut nitrogen-doped crystal ingot; and the section II corresponds to a middle part of the entire to-be-cut nitrogen-doped crystal ingot. Corresponding to the marked nitrogen distribution ranges, the to-be-cut nitrogen-doped crystal ingot can be divided into three parts. Specifically, as shown in FIG. 3, the to-be-cut nitrogen-doped crystal ingot can be cut into three to-be-processed crystal ingot segments. Since each to-be-processed crystal ingot segment corresponds to a nitrogen content distribution range, in the present embodiment, identifiers of various to-be-processed crystal ingot segments can be marked consistent with the marks of the corresponding nitrogen content distribution ranges, that is, marked as I, II, and III. For the three to-be-processed crystal ingot segments shown in FIG. 3, the to-be-processed crystal ingot segment I, which corresponds to the head part of the to-be-cut nitrogen-doped crystal ingot, has the lower nitrogen content. The to-be-processed crystal ingot segment III, which corresponds to the tail part of the to-be-cut nitrogen-doped crystal ingot, has the higher nitrogen content. The to-be-processed crystal ingot segment II, which corresponds to the middle part of the to-be-cut nitrogen-doped crystal ingot, has a nitrogen content between the nitrogen content of the to-be-processed crystal ingot segment I and the nitrogen content of the to-be-processed crystal ingot segment III.

For the technical solution shown in FIG. 2, in some possible implementations, the determining, according to correspondences between nitrogen content ranges and processing conditions, the processing condition corresponding to each to-be-processed crystal ingot segment, comprising:
for each to-be-processed crystal ingot segment, collecting temperature values at a plurality of set radial positions during the wire sawing process;
determining, based on the temperature values at the same radial positions, temperature difference between each to-be-processed crystal ingot segment;
determining, based on the temperature difference between each to-be-processed crystal ingot segment, steel wire feed amounts corresponding to each to-be-processed crystal ingot segment, so that a processing temperature of the to-be-processed crystal ingot segments except for those located at a head of the to-be-cut nitrogen-doped crystal ingot, is consistent with a processing temperature of the to-be-processed crystal ingot segments located at a head of the to-be-cut nitrogen-doped crystal ingot.

For the foregoing implementations, in some examples, among the to-be-processed crystal ingot segments, the steel wire feed amount corresponding to the to-be-processed crystal ingot segment located at the head of the to-be-cut nitrogen-doped crystal ingot is less than the steel wire feed amounts corresponding to the to-be-processed crystal ingot segments, except for those located at the head of the to-be-cut nitrogen-doped crystal ingot.

For the foregoing implementations and their examples, specifically, the foregoing three to-be-processed crystal ingot segments shown in FIG. 3 are taken as an example. Since the nitrogen contents of various to-be-processed crystal ingot segments are inconsistent, in consideration of the positive correlation between nitrogen content and mechanical strength, it can be known that: the mechanical strength of the to-be-processed crystal ingot segment I is weaker than the mechanical strength of the to-be-processed crystal ingot segment II, and the mechanical strength of the to-be-processed crystal ingot segment III is the highest among the three to-be-processed crystal ingot segments. In the process of wire sawing or multi-wire sawing, if all three to-be-processed crystal ingot segments are cut under the processing conditions suitable for the to-be-processed crystal ingot segment I, then due to the excessive mechanical strength of the to-be-processed crystal ingot segments II and III, excessive heat will be generated, causing the processing temperature to rise with a temperature difference with the processing temperature of the to-be-processed crystal ingot segment I formed, thereby increasing the probability of warping problem of the silicon wafers cut from the to-be-processed crystal ingot segments II and III. In order to avoid the occurrence of warping, it is necessary to compensate for the temperature difference. In detail, for the to-be-processed crystal ingot segments I, II, and III, positions of 330 mm, 1060 mm, and 1730 mm are selected along an axial direction from the head of the to-be-cut nitrogen-doped crystal ingot, which respectively correspond to the positions for radial temperature collection of the to-be-processed crystal ingot segments I, II, and III. Specifically, the temperature of the cutting process can be collected at the radial positions of 76 mm, 151.35 mm, and 259.11 mm respectively. As shown in FIG. 3, the temperature values collected at the radial positions of 76 mm, 151.35 mm, and 259.11 mm of the to-be-processed crystal ingot segment I are a, b, and c respectively; the temperature values collected at the radial positions of 76 mm, 151.35 mm, and 259.11 mm of the to-be-processed crystal ingot segment II are a', b', and c' respectively; and the temperature values collected at the radial positions of 76 mm, 151.35 mm, and 259.11 mm of the to-be-processed crystal ingot segment III are a", b", and c". Subsequently, based on the above collected temperature values, the temperature differences between various to-be-processed crystal ingot segments are calculated. In the present embodiment, it is to calculate the temperature difference between the to-be-processed crystal ingot segments I and II and the temperature difference between the to-be-processed crystal ingot segments II and III. The specific calculation results of the temperature differences are shown in Table 1:

TABLE 1

| radial position of crystal ingot (mm) | axial position of crystal ingot (mm) | 330 | 1060 | 1730 | $\Delta T1$ | $\Delta T2$ |
|---|---|---|---|---|---|---|
| 76 | collecting position | a | a' | a" | 0.5 | 0.1 |
|  | temperature (° C.) | 26.2 | 26.7 | 26.8 |  |  |
| 151.35 | collecting position | b | b' | b" | 0.5 | 0.3 |
|  | temperature (° C.) | 30.6 | 31.1 | 31.4 |  |  |
| 259.11 | collecting position | c | c' | c" | 0.4 | 0.4 |
|  | temperature (° C.) | 27.1 | 27.5 | 27.9 |  |  |

Where $\Delta T1$ represents the temperature difference between the to-be-processed crystal ingot segments I and II; $\Delta T2$ represents the temperature difference between the to-be-processed crystal ingot segments II and III.

From the data obtained in Table 1, in order to compensate for the temperature difference during the processing, it is necessary to adjust the processing conditions of each to-be-processed crystal ingot segment, so that the processing temperature of the to-be-processed crystal ingot segments II and III is consistent with the processing temperature of the to-be-processed crystal ingot segment I, to avoid the warping of silicon wafer due to high mechanical strength and excessive heat generated during cutting. In embodiments of the present disclosure, optionally, the processing conditions can specifically be the steel wire feed amount during processing. Combining FIG. 3 and the foregoing content, since the nitrogen content of the to-be-processed crystal ingot segments I, II, and III gradually increases, and thus the mechanical strength also correspondingly increases. Then in order to keep the processing temperature during the cutting process at the processing temperature when cutting the to-be-processed crystal ingot segment I, embodiments of the present disclosure maintains the processing temperature by increasing the steel wire feed amount of the to-be-processed crystal ingot segments II and III. In detail, the steel wire feed amount is characterized by a feed ratio of the steel wire, and the steel wire feed amounts corresponding to the to-be-processed crystal ingot segments I, II, and III are shown in Table 2:

TABLE 2

| identifier of to-be-processed crystal ingot segment | I | II | III |
|---|---|---|---|
| steel wire feed amount | 180% | 200% | 220% |

For the above concept of steel wire feed amount, in detail in the present embodiment, within one processing cycle time, if setting a preset initial wire play-out amount is x, a preset initial wire take-up amount is y, then the steel wire feed amount is x-y, and the feed ratio is considered to be 100%. Within the same cycle time, if setting the wire play-out amount is 2x-y, the wire take-up amount is y, then the steel wire play-out amount is 2*(x-y), and the feed ratio is 200%; if setting the wire play-out amount is 3x-2y, the wire take-up amount is y, then the steel wire feed amount is 3*(x-y), and the feed ratio is 300%, and so on.

Figure 4:
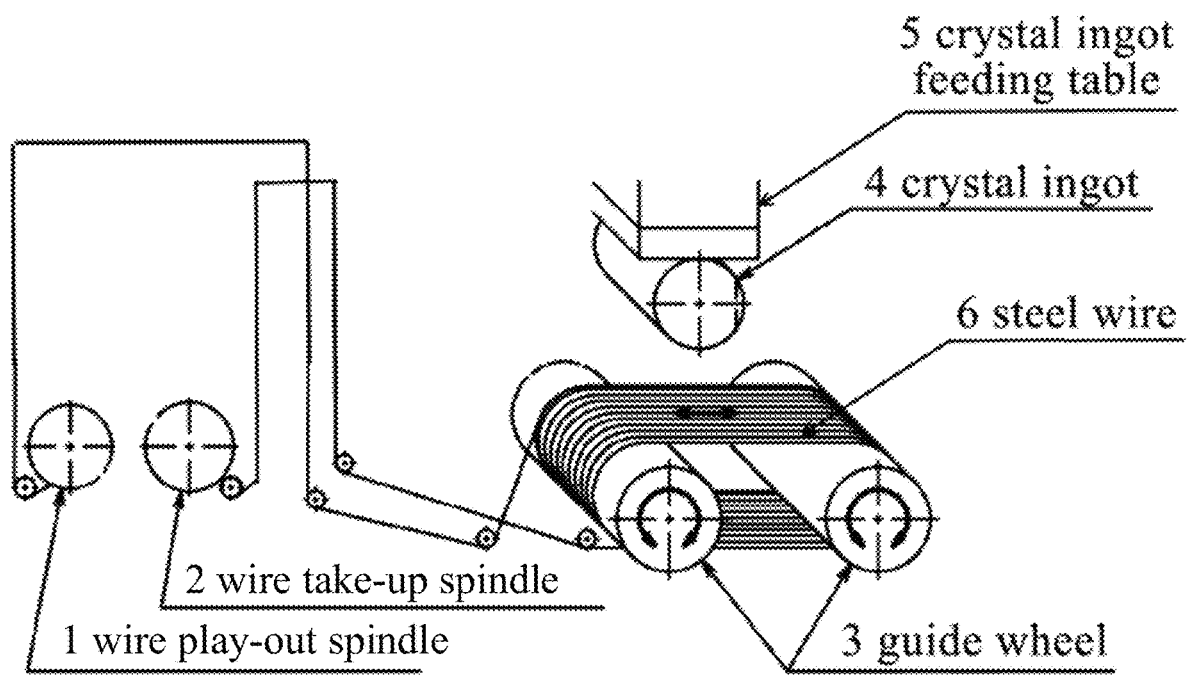
FIG. 4 is a schematic diagram of a multi-wire saw apparatus according to an embodiment of the present disclosure.

According to the above description, after obtaining the steel wire feed amounts corresponding to the to-be-processed crystal ingot segments I, II, and III shown in Table 2, the multi-wire saw apparatus shown in FIG. 4 is taken as an example. In FIG. 4, the apparatus includes a wire play-out spindle 1, a wire take-up spindle 2, a guide wheel 3, a crystal ingot feeding table 5, and a steel wire 6. In the process of cutting the to-be-cut nitrogen-doped crystal ingot 4 by using the apparatus shown in FIG. 4, when cutting the to-be-processed crystal ingot segment I with a small hardness, the steel wire feed amount of the wire play-out spindle 1 is controlled to be a smaller value, such as 180% in Table 2. After the processing of the to-be-processed crystal ingot segment I is completed, the crystal ingot segment II with medium hardness is pasted onto the crystal ingot feeding table 5 in FIG. 4. When cutting the to-be-processed crystal ingot segment II, the steel wire feed amount of the wire play-out spindle 1 is controlled to be larger than the steel wire feed amount when cutting the to-be-processed crystal ingot segment I, such as 200% in Table 2. After the processing of the to-be-processed crystal ingot segment II is completed, the to-be-processed crystal ingot segment III with the highest hardness is pasted onto the crystal ingot feeding table 5 in FIG. 4. When cutting the to-be-processed crystal ingot segment III with a larger hardness, the steel wire feed amount of the wire play-out spindle 1 is controlled to be the largest, such as 220% in Table 2. It is to be understood that at this time the feed amount of new steel wire is large, which can take away the heat generated by mechanical cutting processing in time and avoid severe warping of the silicon wafer due to high temperature, thereby greatly reducing the probability of temperature difference.

Figure 5:
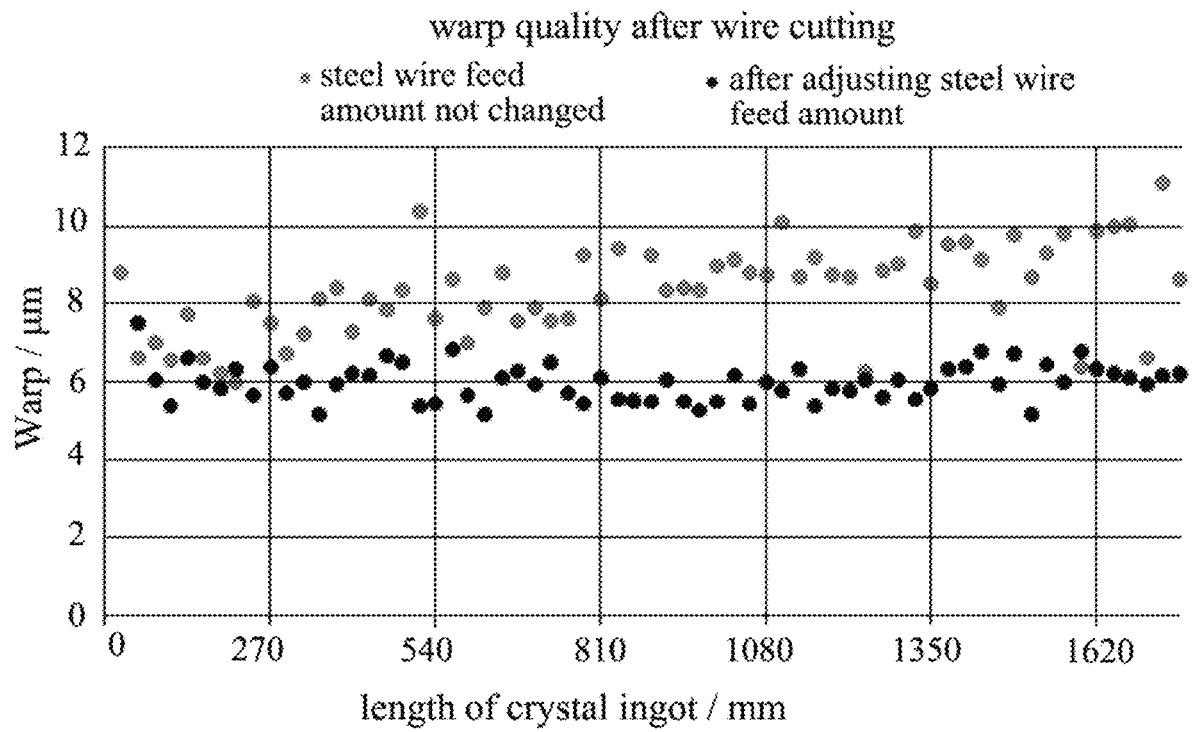
FIG. 5 is a schematic diagram of an effect comparison according to an embodiment of the present disclosure.

The comparison of the warp quality of the wafers obtained by cutting after adjusting the steel wire feed amount by the foregoing technical solution and its implementations and examples and the warp quality of the wafers obtained by cutting using the same processing conditions without adjusting the steel wire feed amount in the current conventional scheme, as shown in FIG. 5, the horizontal axis in the figure represents a position of the to-be-cut nitrogen-doped crystal ingot, and the vertical axis represents a warp value of the wafer, in micrometers (μm). The pure black solid points in FIG. 5 represent the warp after adjusting the steel wire feed amount. The gray solid points represent the warp without adjusting the steel wire feed amount. As can be seen from FIG. 5, compared with the conventional scheme, wafers with better and more uniform flatness can be obtained, and the probability of warping problem is reduced by the technical solution of the embodiments of the present disclosure.

Figure 6:
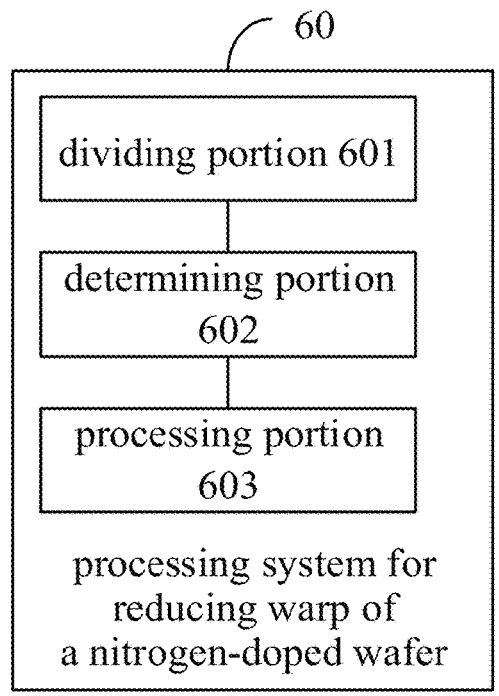
FIG. 6 is a schematic diagram of a processing system for reducing warp of a nitrogen-doped wafer according to an embodiment of the present disclosure.

Based on the same invention concept as the foregoing technical solution, referring to FIG. 6, FIG. 6 shows a processing system 60 for reducing warp of a nitrogen-doped wafer according to an embodiment of the present disclosure. The processing system 60 comprising: a dividing portion 601, a determining portion 602, and a processing portion 603.

The dividing portion 601 is configured to divide, according to nitrogen content distribution, a to-be-cut nitrogen-doped crystal ingot into a plurality of to-be-processed crystal ingot segments, where each to-be-processed ingot segment is corresponding to a nitrogen content range.

The determining portion 602 is configured to determine, according to correspondences between nitrogen content ranges and processing conditions, a processing condition corresponding to each to-be-processed crystal ingot segment, where the processing condition enables the corresponding to-be-processed crystal ingot segment to be prevented from warping during wire sawing.

The processing portion 603 is configured to perform, by using the processing condition corresponding to each to-be-processed crystal ingot segment, cutting processing respectively on the each to-be-processed crystal ingot segment, thereby obtaining a wafer by cutting the to-be-cut nitrogen-doped crystal ingot.

Specifically, the processing portion 603 may be the multi-wire saw apparatus shown in FIG. 4, which is not further described in the embodiment of the present disclosure.

Figure 7:
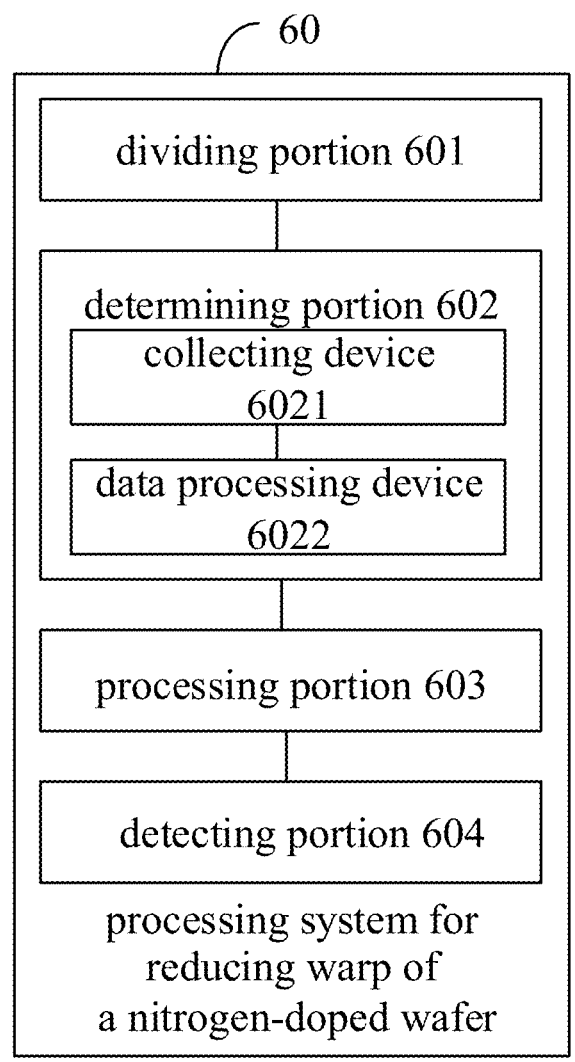
FIG. 7 is another schematic diagram of a processing system for reducing warp of a nitrogen-doped wafer according to an embodiment of the present disclosure.

In some examples, as shown in FIG. 7, the determining portion 602 comprising a collecting device 6021 and a data processing device 6022.

The collecting device 6021 is configured to, for each to-be-processed crystal ingot segment, separately collect temperature values at a plurality of except for radial positions during the wire sawing process.

The data processing device 6022 is configured to determine, based on the temperature values at the same radial position of various to-be-processed crystal ingot segments, temperature differences between various to-be-processed crystal ingot segments, and determine, based on the temperature difference between various to-be-processed crystal ingot segments, steel wire feed amounts corresponding to each to-be-processed crystal ingot segment, so that a processing temperature of the to-be-processed crystal ingot segments except for those located at a head of the to-be-cut nitrogen-doped crystal ingot, is consistent with a processing temperature of the to-be-processed crystal ingot segments located at a head of the to-be-cut nitrogen-doped crystal ingot.

In some examples, the dividing portion 601 is configured to cut, according to nitrogen content distribution, a to-be-cut nitrogen-doped crystal ingot into a plurality of to-be-processed crystal ingot segments.

In some examples, as shown in FIG. 7, the processing system 60 further comprising a detecting portion 604 configured to detect the nitrogen content distribution of the to-be-cut nitrogen-doped crystal ingot.

It is to be understood that, in the embodiment, "portion" may be portion of a circuit, portion of a processor, portion of a program or software and the like, of course, may also be a unit, and may also be modular and non-modular.

In addition, various components in the embodiment may be integrated into a processing unit, each unit may also exist independently, and two or more than two units may also be integrated into a unit. The integrated unit may be implemented in a hardware form and may also be implemented in form of software function module.

When implemented in form of software function module and sold or used not as an independent product, the integrated unit may be stored in a computer-readable storage medium. Based on such an understanding, the essence of the technical solution of the present disclosure or the part that contributes to the related art or the part of the technical solution may be embodied in the form of a software product. The computer software product is stored in a storage medium, includes several instructions which enables a computer device (which may be a personal computer, a server, or a network device, etc.) or a processor to execute all or part of the steps of the methods described in various embodiments of the present disclosure. The storage medium includes various media capable of storing program codes such as U disk, mobile hard disk, ROM, RAM, magnetic disk or optical disk.

Therefore, one embodiment of the present disclosure provides a computer storage medium, which comprising a processing program for reducing warp of a nitrogen-doped wafer stored thereon. The processing program for reducing warp of a nitrogen-doped wafer is performed by at least one processor to perform the method for reducing warp of a nitrogen-doped wafer in above technical solutions.

It is to be understood that the schematic technical solution of the above processing system 60 for reducing warp of a nitrogen-doped wafer has the same conception as the technical solution of the foregoing processing method for reducing warp of a nitrogen-doped wafer. Therefore, detailed contents of the processing system 60 for reducing warp of a nitrogen-doped wafer that are not described in detail may refer to the description of the technical solution of the foregoing processing method for reducing warp of a nitrogen-doped wafer, which are not described herein again.

According to the processing method and system for reducing warp of nitrogen-doped wafer in embodiments of the present disclosure. The to-be-cut nitrogen-doped crystal ingot is divided into different to-be-processed crystal ingot segments according to the nitrogen content ranges. After determining the processing conditions that can avoid the warping phenomenon for each to-be-processed crystal ingot segment respectively, the corresponding to-be-processed crystal ingot segments are cut according to the corresponding processing conditions so as to obtain wafers with good flatness and uniformity and reduce the probability of warping problem.

It is to be noted that the technical solutions described in the embodiments of the present disclosure may be combined arbitrarily without conflict.

The above is only specific implementation of the disclosure, but the protection scope of the present disclosure is not limited to this. Those of ordinary skill in the art may make various variations under the teaching of this application without departing from the spirit of this application and the protection scope of the claims, and such variations all fall within the protection scope of this application. Therefore, the protection scope of the present disclosure should be based on the protection scope of the claims mentioned.

What is claimed is:

1. A processing method for reducing warp of a nitrogen-doped wafer, comprising:

dividing a to-be-cut nitrogen-doped crystal ingot into a plurality of to-be-processed crystal ingot segments, wherein nitrogen concentration per unit length in each of the plurality of to-be-processed crystal ingot segments is within a concentration range, and different to-be-processed crystal ingot segments correspond to different concentration ranges;

determining a processing condition corresponding to each to-be-processed crystal ingot segment according to correspondences between concentration ranges and processing conditions, wherein the processing condition enables the corresponding to-be-processed crystal ingot segment to be prevented from warping during a wire sawing process, wherein the wire sawing process is configured to use steel wire for cutting; and performing the wire sawing process respectively on each to-be-processed crystal ingot segment by using the processing condition corresponding to each to-be-processed crystal ingot segment, thereby obtaining a wafer by cutting the to-be-cut nitrogen-doped crystal ingot;

wherein the determining a processing condition corresponding to each to-be-processed crystal ingot segment according to correspondences between concentration ranges and processing conditions, comprising:

for each to-be-processed crystal ingot segment, collecting temperature values at a plurality of set radial positions before the wire sawing process;

determining temperature differences between the plurality of to-be-processed crystal ingot segments based on the temperature values at same radial positions of the plurality of to-be-processed crystal ingot segments; and determining steel wire feed amounts corresponding to each to-be-processed crystal ingot segment based on the temperature differences between the plurality of to-be-processed crystal ingot segments, so that a processing temperature of to-be-processed crystal ingot segments except for the to-be-processed crystal ingot segment at a head of the to-be-cut nitrogen-doped crystal ingot, is same as a processing temperature of the to-be-processed crystal ingot segment at the head of the to-be-cut nitrogen-doped crystal ingot; wherein the steel wire feed amount represents the processing condition corresponding to each to-be-processed crystal ingot segment, and the steel wire feed amount is represented by a feed ratio of the steel wire, the feed ratio of the steel wire is (wire play-out amount−wire take-up amount)*100%/(preset wire play-out amount−preset wire take-up amount), wherein the preset wire play-out amount is an initial wire play-out amount within one processing cycle time, and the preset wire take-up amount is an initial wire take-up amount within the processing cycle time.

2. The processing method according to claim 1, wherein in each to-be-processed crystal ingot segment, a steel wire feed amount corresponding to the to-be-processed crystal ingot segment at the head of the to-be-cut nitrogen-doped crystal ingot is less than steel wire feed amounts corresponding to the to-be-processed crystal ingot segments except for the to-be-processed crystal ingot segment at the head of the to-be-cut nitrogen-doped crystal ingot.

3. The processing method according to claim 1, wherein the method further comprising:
    detecting a nitrogen content distribution of the to-be-cut nitrogen-doped crystal ingot, wherein the nitrogen concentration per unit length can be obtained from the nitrogen content distribution.

* * * * *